United States Patent
Chakraborty et al.

(10) Patent No.: US 7,409,659 B2
(45) Date of Patent: Aug. 5, 2008

(54) SYSTEM AND METHOD FOR SUPPRESSING CROSSTALK GLITCH IN DIGITAL CIRCUITS

(75) Inventors: Kanad Chakraborty, Bridgewater, NJ (US); Thaddeus J. Gabara, Murray Hill, NJ (US); Kevin R. Stiles, Orefield, PA (US); Bingxiong Xu, Whitehall, PA (US)

(73) Assignee: Agere Systems Inc., Allentown, PA (US)

( * ) Notice: Subject to any disclaimer, the term of this patent is extended or adjusted under 35 U.S.C. 154(b) by 322 days.

(21) Appl. No.: 10/988,083

(22) Filed: Nov. 12, 2004

(65) Prior Publication Data

US 2006/0107245 A1    May 18, 2006

(51) Int. Cl.
- *G06F 17/50* (2006.01)
- *H03K 17/16* (2006.01)
- *H03K 19/003* (2006.01)
- *H01L 25/00* (2006.01)

(52) U.S. Cl. ............... 716/10; 716/5; 716/12; 716/13; 716/9; 326/22; 326/26; 326/30; 326/31; 326/101

(58) Field of Classification Search ............... 716/5, 716/9, 10, 12, 13; 326/22, 26, 30, 31, 101
See application file for complete search history.

(56) References Cited

U.S. PATENT DOCUMENTS

| | | | | |
|---|---|---|---|---|
| 4,154,978 A | * | 5/1979 | Tu | 178/71.1 |
| 4,908,528 A | * | 3/1990 | Huang | 326/24 |
| 5,003,256 A | * | 3/1991 | Merrill | 714/814 |
| 5,059,822 A | * | 10/1991 | Dukes | 326/86 |
| 5,124,579 A | * | 6/1992 | Naghshineh | 326/27 |
| 5,149,990 A | * | 9/1992 | Yamazaki et al. | 326/21 |

(Continued)

FOREIGN PATENT DOCUMENTS

DE    3335517 A * 4/1985

(Continued)

OTHER PUBLICATIONS van Dijk et al., "Reduction of Interconnect Delay by Exploiting Cross-talk", Proceedings of the 27th European Solid-State Circuits Conference, Sep. 18-20, 2001, pp. 301-304.*

(Continued)

*Primary Examiner*—Phallaka Kik
(74) *Attorney, Agent, or Firm*—Mendelsohn & Associates; Steve Mendelsohn (57) ABSTRACT

A static latch circuit is used to suppress crosstalk glitch in a synchronous digital integrated circuit. A static latch is inserted into a selected victim net, and the net is examined if crosstalk glitch induced in the selected victim net is sufficiently suppressed. If not, then the selected victim net is examined to check whether the crosstalk glitch is primarily due to propagated noise from an earlier stage or due to noise injected in the selected victim net. If the crosstalk glitch is propagated from an earlier stage, then a second static latch is inserted before the state in which the first static latch is inserted. Alternatively, another static latch may be inserted in the selected victim net. Cell libraries including a variety of static latch circuit architectures can be designed.

12 Claims, 5 Drawing Sheets

U.S. PATENT DOCUMENTS

| | | | | |
|---|---|---|---|---|
| 5,184,032 A * | 2/1993 | Leach | | 326/98 |
| 5,280,204 A * | 1/1994 | Livolsi | | 326/62 |
| 5,327,022 A * | 7/1994 | Yamada et al. | | 326/21 |
| 5,452,239 A * | 9/1995 | Dai et al. | | 703/19 |
| 5,535,133 A * | 7/1996 | Petschauer et al. | | 716/19 |
| 5,555,506 A * | 9/1996 | Petschauer et al. | | 703/13 |
| 5,596,506 A * | 1/1997 | Petschauer et al. | | 716/5 |
| 5,650,733 A * | 7/1997 | Covino | | 326/24 |
| 5,869,978 A * | 2/1999 | Hong | | 326/24 |
| 5,910,730 A * | 6/1999 | Sigal | | 326/24 |
| 6,066,958 A * | 5/2000 | Taniguchi et al. | | 326/27 |
| 6,117,182 A * | 9/2000 | Alpert et al. | | 716/8 |
| 6,118,318 A * | 9/2000 | Fifield et al. | | 327/206 |
| 6,169,419 B1 * | 1/2001 | De et al. | | 326/58 |
| 6,252,418 B1 * | 6/2001 | Durham et al. | | 326/27 |
| 6,286,128 B1 * | 9/2001 | Pileggi et al. | | 716/18 |
| 6,335,638 B1 * | 1/2002 | Kwong et al. | | 326/83 |
| 6,356,116 B1 * | 3/2002 | Oh | | 326/93 |
| 6,389,581 B1 * | 5/2002 | Muddu et al. | | 716/6 |
| 6,405,350 B1 * | 6/2002 | Tawada | | 716/5 |
| 6,536,030 B1 * | 3/2003 | Tanaka | | 716/17 |
| 6,543,041 B1 * | 4/2003 | Scheffer et al. | | 716/10 |
| 6,549,030 B2 * | 4/2003 | Amick et al. | | 326/28 |
| 6,552,571 B2 * | 4/2003 | Amick et al. | | 326/93 |
| 6,557,145 B2 * | 4/2003 | Boyle et al. | | 716/2 |
| 6,583,656 B1 * | 6/2003 | Liu | | 327/170 |
| 6,615,301 B1 * | 9/2003 | Lee et al. | | 710/106 |
| 6,618,834 B2 * | 9/2003 | Takeyama et al. | | 716/2 |
| 6,637,014 B2 * | 10/2003 | Casavant | | 716/6 |
| 6,678,871 B2 * | 1/2004 | Takeyama et al. | | 716/6 |
| 6,680,629 B2 * | 1/2004 | Rankin et al. | | 327/108 |
| 6,894,540 B1 * | 5/2005 | Ali et al. | | 327/34 |
| 6,910,195 B2 * | 6/2005 | Akkiraju | | 716/6 |
| 6,910,196 B2 * | 6/2005 | Cocchini | | 716/6 |
| 6,915,497 B2 * | 7/2005 | Kitahara | | 716/6 |
| 6,925,624 B2 * | 8/2005 | Komoda | | 716/10 |
| 6,983,436 B2 * | 1/2006 | Amekawa | | 716/5 |
| 6,990,647 B2 * | 1/2006 | Tseng | | 716/8 |
| 7,010,767 B2 * | 3/2006 | Elassaad et al. | | 716/6 |
| 7,062,731 B2 * | 6/2006 | Tetelbaum | | 716/4 |
| 7,068,063 B2 * | 6/2006 | Seike | | 326/27 |
| 7,091,742 B2 * | 8/2006 | Ryan | | 326/27 |
| 7,111,259 B2 * | 9/2006 | Casavant | | 716/6 |
| 7,137,091 B1 * | 11/2006 | Jung et al. | | 716/6 |
| 7,137,097 B1 * | 11/2006 | Aji et al. | | 716/12 |
| 7,193,430 B2 * | 3/2007 | Ookawa | | 326/26 |
| 2001/0010090 A1 * | 7/2001 | Boyle et al. | | 716/2 |
| 2002/0046389 A1 * | 4/2002 | Hirakimoto et al. | | 716/8 |
| 2002/0083398 A1 * | 6/2002 | Takeyama et al. | | 716/1 |
| 2002/0083405 A1 * | 6/2002 | Ishikura | | 716/7 |
| 2002/0116696 A1 * | 8/2002 | Suaya et al. | | 716/6 |
| 2002/0166101 A1 * | 11/2002 | Casavant | | 716/6 |
| 2002/0184607 A1 * | 12/2002 | Alpert et al. | | 716/15 |
| 2003/0009727 A1 * | 1/2003 | Takeyama et al. | | 716/1 |
| 2003/0025524 A1 * | 2/2003 | Amick et al. | | 326/28 |
| 2003/0159121 A1 * | 8/2003 | Tseng | | 716/8 |
| 2003/0229873 A1 * | 12/2003 | Casavant | | 716/6 |
| 2004/0044979 A1 * | 3/2004 | Aji et al. | | 716/13 |
| 2004/0098684 A1 * | 5/2004 | Amekawa | | 716/6 |
| 2004/0128636 A1 * | 7/2004 | Ishikura | | 716/7 |
| 2004/0133867 A1 * | 7/2004 | Kitahara | | 716/6 |
| 2004/0153984 A1 * | 8/2004 | Akkiraju | | 716/6 |
| 2004/0225981 A1 * | 11/2004 | Cocchini | | 716/9 |
| 2004/0255255 A1 * | 12/2004 | Singh | | 716/4 |
| 2005/0060675 A1 * | 3/2005 | Tetelbaum | | 716/5 |
| 2005/0141315 A1 * | 6/2005 | Yoda | | 365/223 |
| 2005/0251775 A1 * | 11/2005 | Wood | | 716/10 |
| 2006/0015834 A1 * | 1/2006 | Amekawa | | 716/5 |
| 2007/0261015 A1 * | 11/2007 | Morgenshtein et al. | | 716/18 |
| 2008/0088343 A1 * | 4/2008 | Masleid et al. | | 326/86 |

FOREIGN PATENT DOCUMENTS

EP    743648 A1 * 11/1996

OTHER PUBLICATIONS

Huang et al., "Global Wire Bus Configuration with Minimum Delay Uncertainty", Design, Automation and Test in Europe Conference and Exhibition, 2003, pp. 50-55.*

Pamunuwa et al., "On Dynamic Delay and Repeater Insertion in Distributed Capacitively Coupled Interconnects", Proceedings of the International Symposium on Quality Electronics Design, 2002, pp. 240-245.*

Li et al., "A Repeater Optimization Methodology for Deep Submicron, High-Performance Processors", IEEE International Conference on Computer Design: VLSI in Computers and Processors, Oct. 15, 1997, pp. 726-731.*

* cited by examiner

SYSTEM AND METHOD FOR SUPPRESSING CROSSTALK GLITCH IN DIGITAL CIRCUITS

TECHNICAL FIELD

The present invention is related in general to design of integrated circuits, and in particular to the design of circuits to reduce or suppress crosstalk glitch.

BACKGROUND

Integrated circuit technologies at 0.13 microns and below use thinner and longer wires thereby increasing wire-to-wire coupling capacitance. Due to capacitive coupling, a transition that occurs on a first net (aggressor) may be partially transmitted to a second net (victim), thereby resulting in a change in the delay in the victim, which may also include a change in logic transition in the victim. This cross-coupling effect (crosstalk) creates noise problem, which is especially pronounced at deep sub-micron processing such as 90 nm or below. Crosstalk causes glitches in static signals, delay variation in signals in transition and sometimes glitches are also possible on signals in transition.

Figure 1:
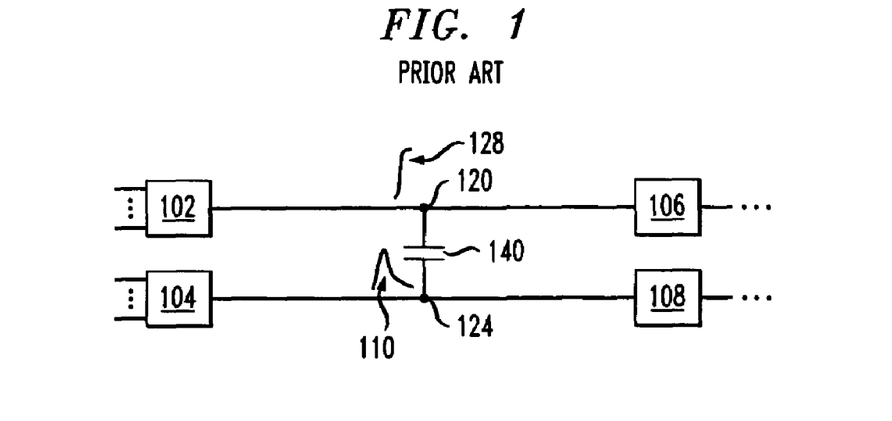
FIG. 1 shows how a signal transition in an aggressor net is induced into a victim net.

Referring now to the drawings, FIG. 1 (prior art) shows driver circuits 102 and 104 drive receiver circuits 106 and 108 respectively. Coupling capacitance 140 affects the performance of nets 120 and 124 in that signal driven along net 120 induces a crosstalk glitch in net 124. Net 120 is therefore called an aggressor net and net 124 is understood as a victim net. It should be understood that coupling capacitance 140 is depicted as a lumped element for the sake of simplicity, it is in reality a distributed capacitance between the aggressor net 120 and victim net 124. As a result of the coupling capacitance, a signal with a sharp signal slope 128 may result in a noise glitch 126 in the victim net 124.

FIG. 1 shows a simplistic view of how crosstalk glitch affects a victim. When a signal transition occurs in neighboring wires, the coupling capacitance between the wires causes a transfer of charge from a net where a signal transition occurs to a net where no transition occurs. The former is called an aggressor net and the latter a victim net. The nature and intensity of the crosstalk glitches depend on the switching speed of the signals in the aggressor net, and the amount of mutual crosstalk capacitance between the wires. Though the aggressor net and victim net are shown as different tracks in the figure, it should be understood that each track may be formed from multiple segments that occupy multiple layers of metallization.

Known methods of minimizing crosstalk require a significant amount of place-and-route modifications that are often accompanied by design rule errors as well as timing issues to an already synthesized, placed and routed design, resulting in difficulties in design closure. That is because known methods work on all crosstalk victims in a design and attempt to fix them one by one, even though only a subset of victims (namely, those that drive either primary outputs or data inputs of flip-flops) will actually cause timing or functional failure. Therefore, there is a need for an improvement in the art.

SUMMARY OF THE INVENTION

We have discovered that by placing a static latch circuit comprising a forward inverter and a feedback inverter on a victim net, one could suppress the crosstalk glitches in the victim. A static latch is inserted into a selected victim net, and the net is examined to check if the crosstalk glitch is suppressed sufficiently. In an embodiment, such examination starts at an output port or at an input port of a flip-flop.

We observed that crosstalk noise on a victim net in a digital circuit (a) can be injected from an aggressor net, or (b) can propagate through one or more levels of logic gate(s) driving the victim, or (c) both (a) and (b) can happen. Thus, in a selected victim net, crosstalk noise can be suppressed either by inserting one or more static latches along the victim's signal path or by tuning an inserted static latch. Alternatively, because there could be one or more predecessor victim nets, that is, victim nets from which crosstalk noise propagated to the selected victim net, suppressing crosstalk noise in a predecessor net may result in suppressing crosstalk noise in the selected victim net. In this application the term "present stage" is used synonymously with the term "selected victim net," and "earlier stage" is used synonymously with a "predecessor victim net." Note that in some cases there could be no predecessor net.

If upon examination the crosstalk glitch is not sufficiently suppressed, then we examine whether crosstalk glitch induced in the selected victim net is primarily the result of propagated noise from an earlier stage or due to noise injected in the selected victim net. If the crosstalk glitch is propagated from an earlier stage, then a second static latch is inserted at a stage earlier than the stage in which the first static latch is inserted. Many designs of static latches are described. In one aspect, the static latch has an even number of inverters in a feedback path. In another aspect, a feedback path is established from a second one of at least two inverters in the signal path to the first one of the two inverters, alternatively, either via a bus-keeper circuit or via a pair of feedback transistors. This configuration is advantageous because unlike other known methods, a synthesized design can be minimally disrupted. Precharacterized cell libraries can be designed with various configurations of static latch circuits so that they could be used readily with ease.

BRIEF DESCRIPTION OF THE DRAWINGS

These and other features, objects and advantages are more readily apparent from the following detailed description of the presently preferred embodiments in conjunction with the accompanying drawings illustrating the principles of the present invention, where like numbers designate like parts, and wherein.

DETAILED DESCRIPTION

We have observed that a crosstalk glitch causes functional failure in a victim if it affects either a primary output or a data input to a flip-flop, and in the case of the latter scenario, the crosstalk effect is a problem during the so-called "metastable window" for the flip-flop, that is, from the setup time ($T_{setup}$) before the clock edge to the hold time ($T_{hold}$) after the clock edge. That observation led us to discover that by inserting a static latch into a particular crosstalk victim that either directly feeds into a data input of a flip-flop or is connected to a primary output of a chip, one could suppress the crosstalk by the combined effect of noise rejection at the gate of a CMOS inverter and charge restoration at the drain of a feedback inverter that improves the noise immunity of the first inverter.

Figure 1A:
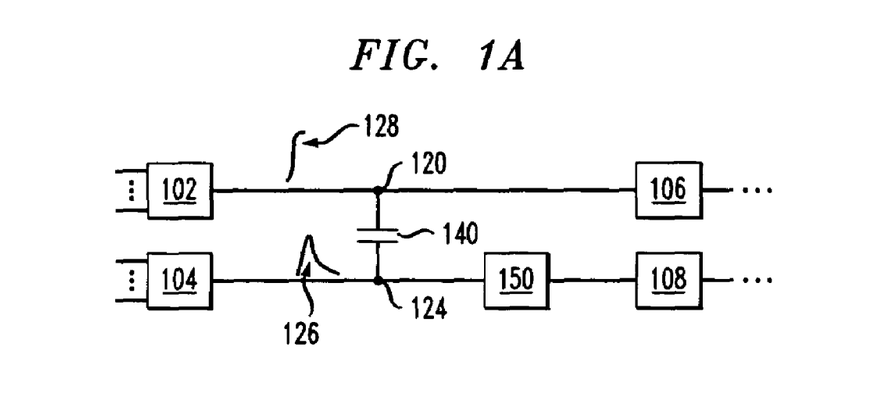
FIG. 1A illustrates a static latch circuit configured to perform in accordance with the principles of the present invention.

Referring to FIG. 1A, a static latch 150 according to the principles of the invention is inserted along the victim net 124. Note that the static latch 150 may be inserted anywhere along the victim net 124, that is, at a point near or on the driver circuit 104, at a point near or on the receiver circuit 108, or at any point in between.

The static latch includes two inverters along a signal path and two inverters along a feedback path. The inverters are sized optimally via transistor-level circuit simulation for filtering a range of noise glitch voltages and widths. To facilitate easy design and implementation, one may create a library of static latches.

After inserting a static latch into a victim we examine if the crosstalk glitch in the selected victim has been suppressed sufficiently. If the crosstalk glitch in the selected victim has been suppressed below a predetermined threshold level, then the examination of that victim is deemed complete. If, on the other hand, the crosstalk glitch in the selected victim is not below the predetermined threshold level, we use circuit simulation to determine whether the noise is primarily due to propagated noise from an earlier stage or due to noise injected in a selected stage. In the case of the former, that is, if the crosstalk is primarily propagated from a previous stage, then the designer may insert another static latch at a prior stage and continue the process until the crosstalk is substantially filtered out. In the case of the latter, that is, if the crosstalk is primarily due to the selected stage, then the static latch is either reconfigured or tuned, or another stage of static latch may be inserted.

This design preserves the logic of an already synthesized design and disturbs the design only minimally, where necessary for a selected victim, and thus, this method is advantageous because it uses static latches sparingly. Further, each latch adds only two inverters to the timing path. Note that the feedback path is not a part of the critical path and therefore the inverters in the feedback path do not contribute to the timing delay. The feedback inverters cause signal slope degradation for a valid input transition. However, this signal slope degradation occurs only for a very short duration and depends on the total delay through the inverter loop. Further, the signal slope degradation typically lasts only for a small fraction of the clock period. Such slope degradation will produce slightly greater delays in the forward inverters driving the signal; however, these inverters will also improve the signal slope that is propagating to the downstream flip-flop input or primary output.

Additional benefits of this methodology include less hardware and delay overhead than other known techniques, thereby allowing a chip designer better control over the timing/noise-loop closure and a quicker tape out, and because the latch circuits can be pre-characterized and classified according to a targeted range of crosstalk glitches, they can be readily instantiated from a library, thereby saving design time.

A static latch is a type of a sequential circuit using a positive feedback or regeneration loop, that is, one or more outputs are connected back to the inputs. Static latches such as those used in this design receive data input but need not necessarily receive separate clock input.

Types of static latches such as those described below as well as other embodiments of static latches, for example, such as those described in U.S. Pat. No. 6,348,824 may be used to accomplish the goals stated herein. In the type of latch described in the referenced patent, a static latch includes two individual data paths, a first data path used for passing the data on an output driver for driving a voltage level at the output, and a second data path is used for storing the data in a feedback structure so the latch can continue to drive the voltage level at the output node until the next data is loaded into the latch.

Figure 2:
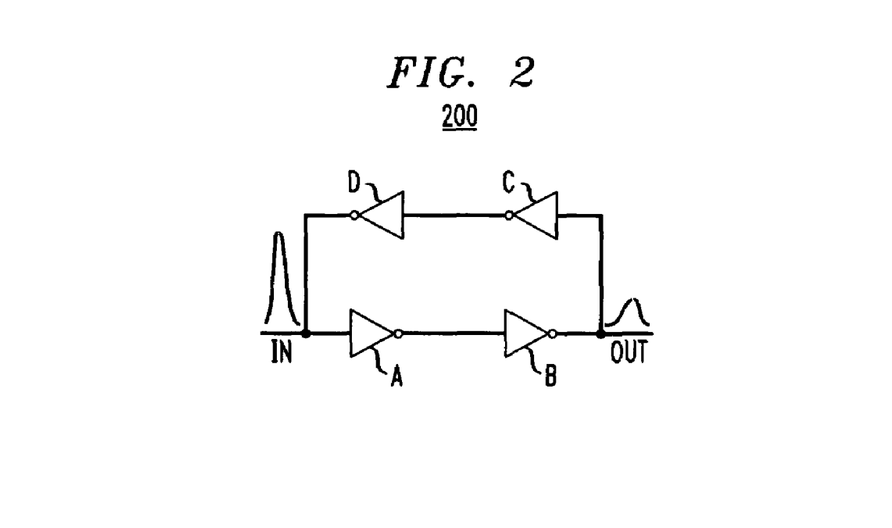
FIG. 2 shows one embodiment of the static latch circuit of FIG. 1B.
Figure 2A:
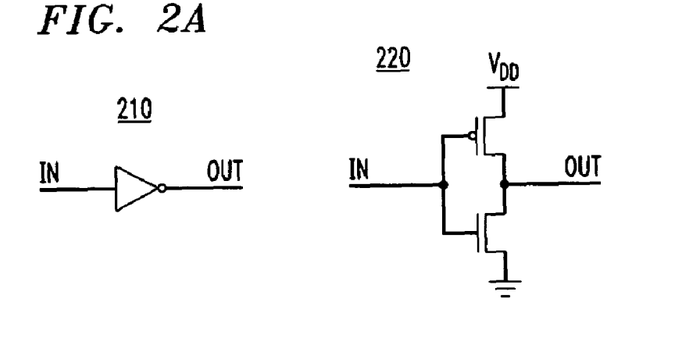
FIG. 2A illustrates two equivalent depictions of inverter circuits used in this application.

Referring now to the drawings, FIG. 2 shows a static latch circuit to suppress crosstalk glitch at the input node IN. FIG. 2A shows two alternative and equivalent depictions 210 and 220 for an inverter circuit as used in the invention herein. In FIG. 2, inverters A and B are placed in a forward path (input) of a circuit where crosstalk glitch is to be suppressed. Inverters C and D are placed in a feedback path of the circuit as shown in the figure. The combined action of noise rejection at the input of inverters A and B and charge restoration (i.e., charge holding) at the drain of the feedback inverter D results in suppressing the crosstalk glitch. It is believed that the feedback circuit including inverters C and D introduces a large delay and makes the charge holding possible.

The circuit functions in the following manner. Suppose that each of the four inverters in this configuration has a delay of 20 ps, which is typical of modern CMOS technologies. Then, after the glitch appears at the input node IN, the voltage at the gate of inverter D would be maintained for at least 60 ps, that is, three inverter delays. In practice, much less time, such as possibly 20-30 ps, would be necessary for inverter D to provide a current path through one of its two transistors that restores the charge at its drain to maintain the steady-state voltage at IN. However, if we used a smaller (i.e., faster) feedback loop consisting of fewer, for example, two inverters instead, then the delay through the loop might not be sufficiently large to achieve charge restoration. Note that the inverter D would have to be very small (i.e., it should have a large delay) because it is not desired to have inverter D cause much slope degradation for a legitimate input data transition at the node IN. Therefore, it is preferable to create a large enough delay in the feedback path. In other words, this circuit works on the principle that the feedback path (through three inverters, A, B, and C) is slower than the recovery path through the single inverter D.

Figure 3:
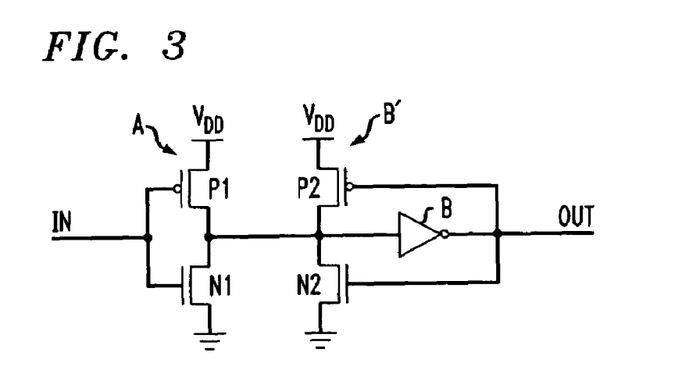
FIGS. 3 and 4 show embodiments of static latches designed to eliminate feedback inverters C and D.

FIG. 3 shows a variation of the design of the static latch of FIG. 2 by eliminating feedback inverters C and D. Instead this design relies on feedback from inverter B to inverter A by way of an inverter B'. It should be noted that the inverters B and B' together might be viewed as a typical bus-hold circuit. Whereas a typical bus-hold circuit is used to maintain a prescribed logic state on a bus even where driver circuits driving the bus are put in a high impedance (tri-state) mode. In general, a bus-hold or a bus-keeper circuit includes two inverters, for example of the CMOS type, coupled together as shown in FIG. 3. The bus-keeper keeps and regenerates an input signal applied to a signal line coupled to the input of the input circuit. A first inverter, for example, inverter B in FIG. 3, receives an input signal and outputs a regenerated signal, which is then supplied to a receiver circuit. A second inverter, e.g., B' in FIG. 3, is fed at its input an output of the first inverter B. In certain noise scenarios, feedback from B to A may be sufficient to suppress a noise glitch and it may not be necessary to have two additional feedback inverters to restore steady state voltage. Eliminating C and D is advantages because it may reduce signal slope degradation for a legitimate input data transition at node IN. Improving signal slopes at gate inputs causes smaller gate delays and is therefore beneficial from a timing closure standpoint. Another advantage of the static latch shown in FIG. 3 is that it uses a minimal number of transistors and therefore, consumes less power than other static latches. The design of FIG. 3, however, has a disadvantage in that it produces a current path from $V_{DD}$ to ground for a small duration during an input transition, thereby causing higher power dissipation.

Figure 4:
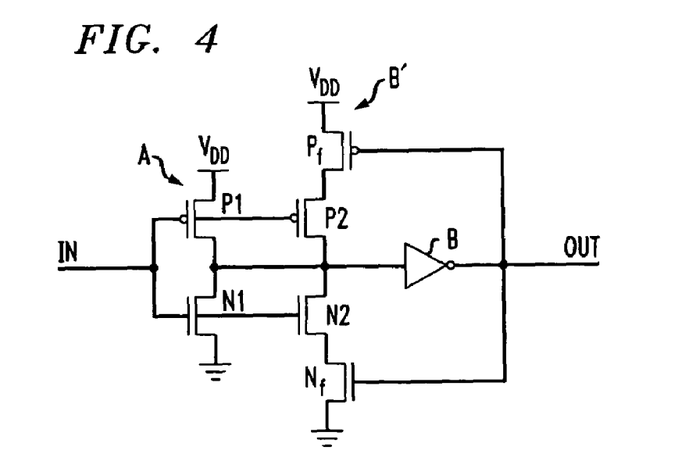

FIG. 4 shows an embodiment of a static latch designed to eliminate feedback inverters C and D (of FIG. 2), and instead to rely only on feedback from inverter B to inverter A. In certain noise scenarios, feedback from B to A might be sufficient to suppress a noise glitch and it may not be necessary to have two additional feedback inverters to restore the steady state voltage. Eliminating C and D has an additional benefit of reducing signal slope degradation for a legitimate input data transition at the node IN. Improving signal slopes at gate inputs causes smaller gate delays and is therefore advantageous from a timing closure standpoint. Another advantage of the design shown in FIG. 4 is that it uses fewer transistors and therefore, consumes less power than the circuit shown in FIG. 2.

Figure 5:
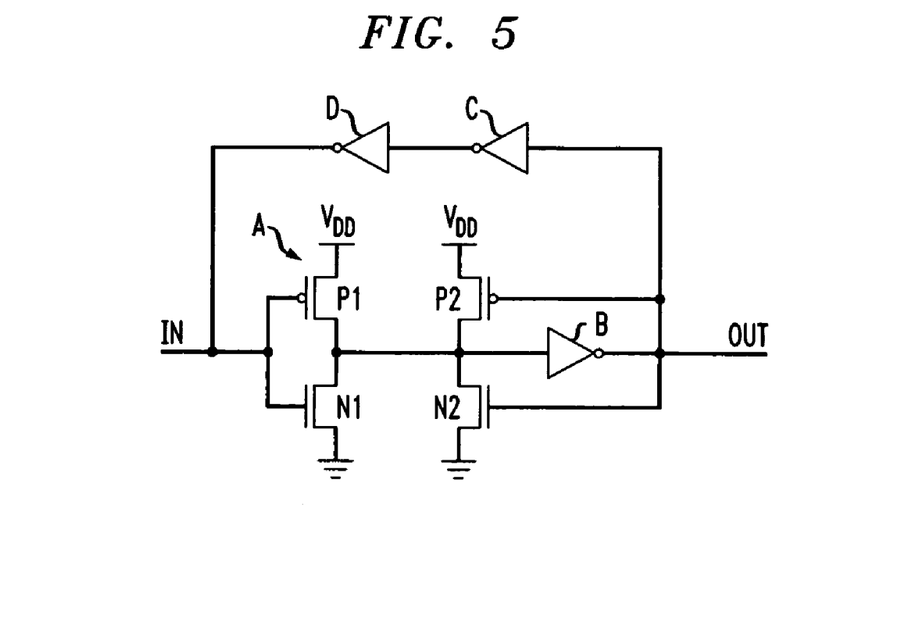
FIG. 5 shows a variation of FIG. 3, designed to improve the noise immunity of the first inverter in the forward path.

FIG. 5 shows a static latch circuit configured using a principle of operation similar to that in FIG. 3. Feedback from the output of inverter B is applied directly to two additional transistors N2 and P2, in such a way as to allow one N-channel pulldown device (selected from N1 and N2) and one P-channel pullup device P1 to be simultaneously turned on, thereby improving the noise immunity of inverter A. In an alternative configuration, Feedback from output of inverter B is applied directly to the two additional transistors N2 and P2 so that one P-channel pullup device (selected from P1 and P2) and one N-channel pulldown device N1 to be simultaneously turned on, which improves the noise immunity of inverter A.

The circuit of FIG. 5 has the advantage over that in FIG. 4 in that the circuit of FIG. 5 uses fewer transistors. However, a disadvantage of the design of FIG. 5 over that in FIG. 4 is that because of the delay from IN to OUT, FIG. 5 design produces a current path from $V_{DD}$ to ground (thereby causing a greater power dissipation) for a small duration, through the "on"-transistor-pair <P1, N2> or <P2, N1>, when the input IN is switching from high to low or from low to high, respectively, during a normal data transition.

Figure 6:
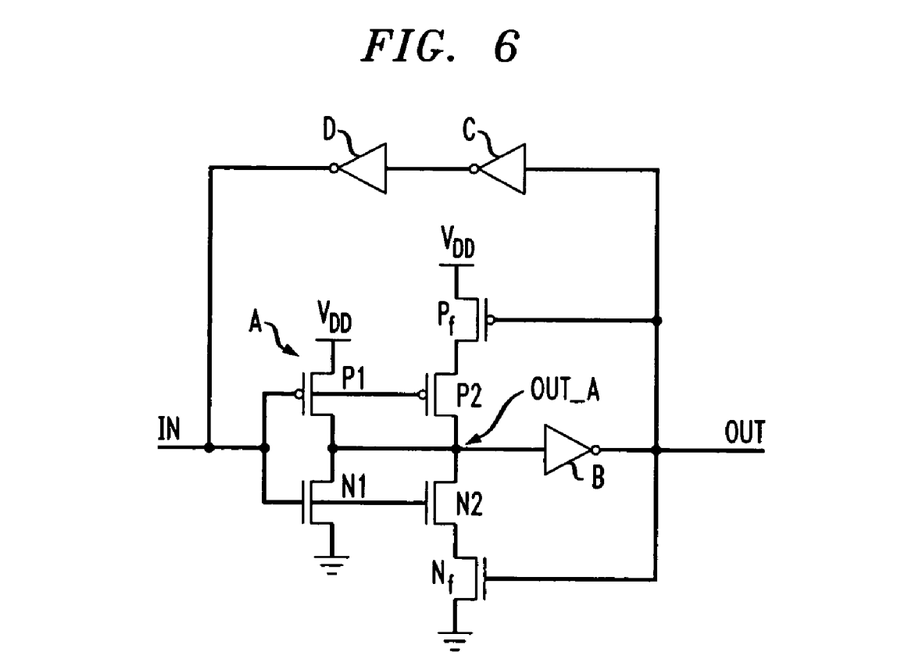
FIG. 6 shows a version of an embodiment of FIG. 4 with a static latch circuit including inverters along the signal path, with a feedback from the second inverter to the first inverter.

FIG. 6 shows a static latch circuit of the type used in FIG. 2 and uses feedback from inverter B to inverter A, and feedback from inverter D to inverter A. Feedback from inverter B to inverter A increases the threshold voltage of inverter A thereby increasing its noise immunity. This can be understood as follows. Suppose input IN is at a high voltage. Then output OUT would also be at high voltage and feedback transistor $N_f$ will be turned on and feedback transistor $P_f$ will be turned off. This causes pulldown N-channel devices N1 and N2 to turn on, that is, connected in parallel between the output node OUT_A and ground. At this point, only one pullup P-channel device P1 connects this output node to the power supply $V_{DD}$. Because in this configuration, the pulldown is stronger than the pullup, inverter A would suppress "below-high" type of noise, i.e., noise glitch at the input node IN that causes its voltage to drop.

On the other hand, if the input IN is at a low voltage, then OUT is also low and the transistor $P_f$ will be turned on whereas transistor $N_f$ will be turned off. This causes two pullup P-channel devices P1 and P2 to be turned on, that is, connected in parallel between the output node OUT_A and the power supply voltage $V_{DD}$, and only one pulldown N-channel device N1 to be connected between OUT_A and ground. Therefore, inverter A would suppress "above-low" type of noise, that is, a positive noise glitch at the input node IN. Additionally, the feedback inverter D of FIG. 6 weakens the glitch at the input node and restores the steady-state voltage, which is similar in operation to that of the circuit shown in FIG. 2. Therefore, for a strong input noise glitch, the combined effect of increasing noise immunity along the signal path and weakening the glitch using the feedback path, contribute to crosstalk noise suppression.

Figure 7:
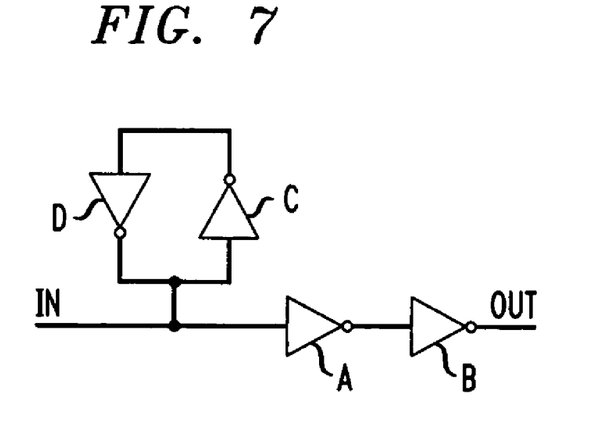
FIG. 7 shows another embodiment of a static latch design configured to provide noise reduction in addition to crosstalk suppression.

FIG. 7 shows a static latch circuit, which includes a bus-holder circuit implemented with a pair of inverters C and D. A bus-holder circuit is also known as a bus-keeper circuit. A bus-holder circuit includes a pair of cross-coupled inverters, that is, it can be implemented with four transistors, which begin and end at the same pin. These circuits are used to store data on buses and are not particularly designed for noise reduction. Therefore, bus-hold circuits have lower noise immunity than other configurations described herein because the feedback paths are short. It is to be noted that a bus-holder circuit inverts the logic of the signal, and therefore there is a need to design these circuits so as to preserve the logic of an already synthesized design.

Referring to FIG. 7, a buffer including inverters A and B is shown. While inverters A and B suppress forward propagation of a noise glitch to an output node, inverters C and D weaken the input glitch by providing a restoring current path through one of the two transistors in D. The resultant effect is a sufficient level of noise filtering above and beyond what would be achieved using either a single bus-holder or a single buffer.

Figure 8:
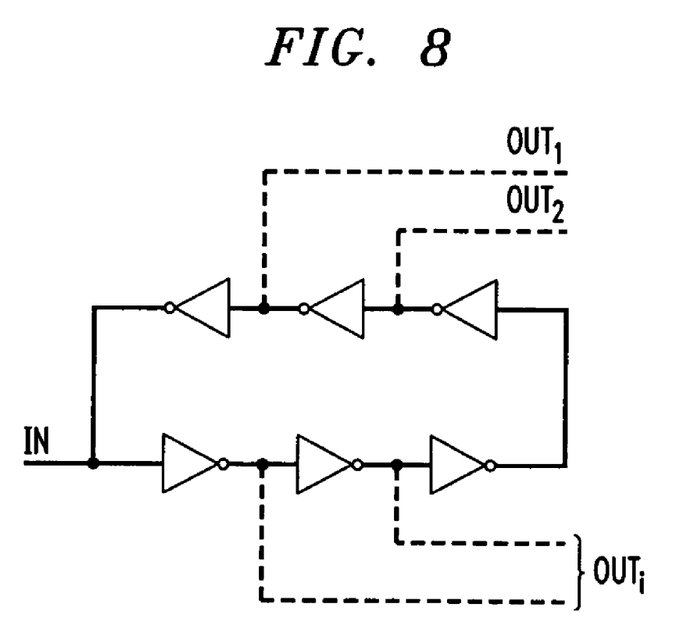
FIG. 8 shows a latch that includes 2n (where n is a positive integer) inverters with the ability to tap off at various intermediate points to achieve various delays.

FIG. 8 shows a yet another configuration of a static latch circuit including an even number of inverters arranged in a feedback loop. The principle of operation is similar to that of a 4-inverter static latch, for example, that shown in FIG. 2. In this configuration, a chain of forward inverters provides noise filtering and a chain of feedback inverters drives the input node, restoring its charge. Furthermore, this design provides the added flexibility of tapping off either inverted or non-inverted outputs from various intermediate points in the circuit to achieve various delays.

Figure 9:
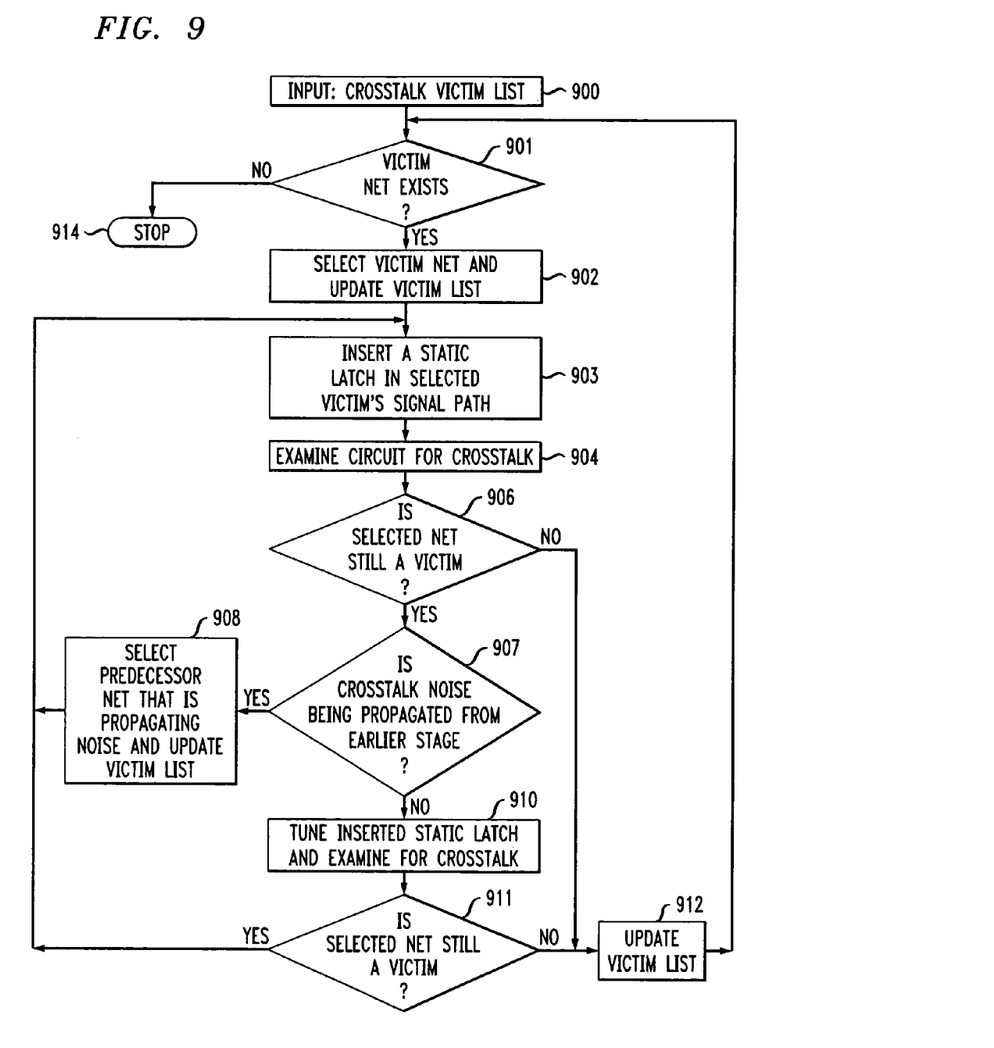
FIG. 9 is a flow chart illustrating some steps involved in reducing crosstalk glitch in a victim net according to principles disclosed herein.

FIG. 9 is a flow diagram of the steps used in the method of suppressing or eliminating crosstalk glitches in a selected victim net. A designer inputs a crosstalk victim list (step 900). If there are one or more victims in the list (step 901), the designer selects a victim and updates the victim list (step 902). The designer inserts a static latch on the victim's signal path (step 903). Note that the order of these steps is not critical and a person of skill in the art may alter the sequence of these steps. Moreover, one or more steps could be combined or there could be sub-steps in these that are well understood.

The designer simulates the performance of the circuit so modified by the inserted static latch and examines the circuit (step 904). The examination is done preferably from an output port or at the input port of a flip-flop, but other points could be the starting points of examination. If the net is still a victim of crosstalk noise (step 906), then it could be either due to noise propagated from an earlier stage, or crosstalk is introduced in the victim (step 907).

If the crosstalk is due to an earlier stage, a victim in a predecessor stage (to the selected victim net) is selected, and a static latch is inserted in the selected predecessor victim net (step 908). The victim is then examined again (step 904). The examination/insertion/examination process iterates until the crosstalk is substantially reduced.

If the crosstalk is injected in the selected net, the inserted static latch is tuned (step 910). Then the net is examined to see if the selected net is still a victim (step 911), and if so, another static latch is added to the tuned selected victim (step 903) and the net is examined again (step 904). This examination/insertion-or-tuning/examination process iterates until crosstalk is substantially reduced.

If at step 911 or at step 906 the selected net is determined not to be a victim, then the victim list is updated (step 912) and the process iterates (step 901) until no victim remains (step 914).

The foregoing describes a method and system of using static latches to suppress crosstalk glitches in a synchronous digital circuit. The circuit may be an integrated circuit or a single-chip solution. Persons of ordinary skill in the art may modify these embodiments without significantly departing from the spirit or scope of the principles invented or without undue experimentation. For example, the principles may be applied to combinations of circuits that are illustrated herein, or to other types of circuits, for example, asynchronous logic circuits. An attenuator or other method of suppressing or otherwise reducing crosstalk glitch may also be used in conjunction with the invented design to further suppress the crosstalk glitch. All such modifications and departures are properly within the scope of the following appended claims.

What is claimed is:

1. An apparatus comprising an integrated circuit comprising a digital circuit comprising:
   a first net;
   a second net, wherein the second net induces a crosstalk glitch in the first net; and
   a first static latch wherein the first static latch is connected to the first net, whereby crosstalk glitch in the first net is reduced, wherein the first static latch comprises:
      a first inverter having (i) an input node connected to the first net and (ii) an output node;
      a second inverter in series with the first inverter and having (iii) an input node connected to the output node of first inverter and (iv) an output node connected to the first net; and
      a third inverter comprising a first p-type transistor, a second p-type transistor, a first n-type transistor, and a second n-type transistor, wherein:
         the first p-type transistor is connected in series with the second p-type transistor to the output node of the first inverter and the input node of the second inverter;
         the first n-type transistor is connected in series with the second n-type transistor to the output node of the first inverter and the input node of the second inverter;
         gates of the first p-type transistor and the first n-type transistor are directly connected to the output node of the second inverter; and
         gates of the second p-type transistor and the second n-type transistor are directly connected to the input node of the first inverter.

2. The apparatus of claim 1, said digital circuit further comprising:
   a second static latch coupled to the first static latch, whereby the second static latch further suppresses noise glitch induced in the first net.

3. The apparatus of claim 1, where the first static latch further comprises a feedback path communicably coupling the output node of the second inverter to the input node of the first inverter.

4. The apparatus of claim 3, wherein the feedback path comprises at least two inverters.

5. The apparatus of claim 4, wherein the at least two inverters are an even number of series-connected inverters wherein:
   an input node of the series-connected inverters is directly connected to the output node of the second inverter; and
   an output node of the series-connected inverters is directly connected to the input node of the first inverter.

6. The apparatus of claim 1, wherein the first static latch is connected in series with the first net.

7. A cell library comprising a static latch suitably configured to suppress crosstalk glitch by inserting in a signal path of a selected victim net, wherein the static latch comprises:
   a first inverter having (i) an input node connected to a first net and (ii) an output node;
   a second inverter in series with the first inverter and having (iii) an input node connected to the output node of first inverter and (iv) an output node connected to the first net; and
   a third inverter comprising a first p-type transistor, a second p-type transistor, a first n-type transistor, and a second n-type transistor, wherein:
      the first p-type transistor is connected in series with the second p-type transistor to the output node of the first inverter and the input node of the second inverter;
      the first n-type transistor is connected in series with the second n-type transistor to the output node of the first inverter and the input node of the second inverter;
      gates of the first p-type transistor and the first n-type transistor are directly connected to the output node of the second inverter; and
      gates of the second p-type transistor and the second n-type transistor are directly connected to the input node of the first inverter.

8. The cell library of claim 7, where the first static latch further comprises a feedback path communicably coupling the output node of the second inverter to the input node of the first inverter.

9. The cell library of claim 8, wherein the feedback path comprises at least two inverters.

10. The cell library of claim 9, wherein the at least two inverters are an even number of series-connected inverters, wherein:
    an input node of the series-connected inverters is directly connected to the output node of the second inverter; and
    an output node of the series-connected inverters is directly connected to the input node of the first inverter.

11. An apparatus comprising an integrated circuit comprising a digital circuit comprising:
    a first net;
    a second net, wherein the second net induces a crosstalk glitch in the first net; and
    a first static latch wherein the first static latch is connected to the first net, whereby crosstalk glitch in the first net is reduced, wherein the first static latch comprises:
       a first inverter having (i) an input node connected to the first net and (ii) an output node;

a second inverter in series with the first inverter and having (iii) an input node connected to the output node of first inverter and (iv) an output node connected to the first net;

a third inverter having (v) an input node connected to the output node of the second inverter and (vi) an output node connected to the output node of the first inverter and to the input node of the second inverter; and a feedback path communicably coupling the output node of the second inverter to the input node of the first inverter, wherein:

the feedback path comprises an even number of series-connected inverters;

an input node of the series-connected inverters is directly connected to the output node of the second inverter; and an output node of the series-connected inverters is directly connected to the input node of the first inverter.

12. A cell library comprising a static latch suitably configured to suppress crosstalk glitch by inserting in a signal path of a selected victim net, wherein the static latch comprises:

a first inverter having (i) an input node connected to a first net and (ii) an output node;

a second inverter in series with the first inverter and having (iii) an input node connected to the output node of first inverter and (iv) an output node connected to the first net;

a third inverter having (v) an input node connected to the output node of the second inverter and (vi) an output node connected to the output node of the first inverter and to the input node of the second inverter; and a feedback path communicably coupling the output node of the second inverter to the input node of the first inverter, wherein:

the feedback path comprises an even number of series-connected inverters;

an input node of the series-connected inverters is directly connected to the output node of the second inverter; and an output node of the series-connected inverters is directly connected to the input node of the first inverter.

* * * * *